United States Patent [19]

Isaacson

[11] 3,766,439

[45] Oct. 16, 1973

[54] ELECTRONIC MODULE USING FLEXIBLE PRINTED CIRCUIT BOARD WITH HEAT SINK MEANS

[75] Inventor: Herbert M. Isaacson, Fayetteville, N.Y.

[73] Assignee: General Electric Company, Syracuse, N.Y.

[22] Filed: Jan. 12, 1972

[21] Appl. No.: 217,202

[52] U.S. Cl. ............. 317/100, 317/101 F, 174/68.5

[51] Int. Cl. ............................................. H05k 7/20

[58] Field of Search.................... 317/100, 117, 118, 317/120, 101 F, 101 CB, 101 CW; 124/68.5, 15 R, 16 R, DIG. 5

[56] References Cited

UNITED STATES PATENTS

| | | | |
|---|---|---|---|
| 3,039,177 | 6/1962 | Burdett | 317/101 CC |
| 3,255,299 | 6/1966 | Hartsock | 174/68.5 |
| 2,997,521 | 8/1961 | Dahlgren | 174/68.5 |
| 3,499,220 | 3/1970 | Hintz | 317/101 F |
| 2,892,131 | 6/1959 | MacDonnell | 317/101 F |
| 3,582,865 | 6/1971 | Endicott | 317/100 |
| 3,475,657 | 10/1969 | Knowles | 317/100 |
| 3,522,486 | 8/1970 | Johns | 317/100 |

FOREIGN PATENTS OR APPLICATIONS

| | | | |
|---|---|---|---|
| 1,908,445 | 11/1969 | Germany | 317/101 F |

*Primary Examiner*—Robert K. Schaefer
*Assistant Examiner*—Gerald P. Tolin
*Attorney*—Carl W. Baker et al.

[57] ABSTRACT

An electronic circuit component having particular utility in multi-layer circuit board construction formed essentially of a flexible dielectric sheet of material used as the board base to which is attached circuit runs etched from copper sheets clad to the dielectric sheet prior to etching. Generally, circuitry runs are separated according to alignment with either the X or Y axis with the runs on each side of the dielectric sheet being parallel to only one of those axes. Integration of communication between X and Y runs is by means of plated through holes to which circuit elements may be attached. Flatpack integrated circuits are attached to the board oriented with their covers toward and their heat sink base portions away from the board. By placing all flatpacks on one side of the flexible board structure and looping the structure back on itself, a high circuit component density can be achieved with the heat sink portions of flatpacks exposed exteriorly of the loops of the structure facilitating placing the flatpacks in heat conducting contact with a casing.

3 Claims, 3 Drawing Figures

ELECTRONIC MODULE USING FLEXIBLE PRINTED CIRCUIT BOARD WITH HEAT SINK MEANS

FIELD OF THE INVENTION

The invention pertains to the art of printed circuit board construction and particularly to boards used with multielement components to form modules. More specifically, the invention is directed to high circuit density constructions with provisions for management of thermal problems.

PRIOR ART

Printed circuit board construction of electronic components has developed along many lines. Generally, conductive material has been stencilled or printed on a dielectric plate base and by successive etching or chemical deposition steps, several or more alternating levels of electrically active or insulating strata are built on that base. Construction may include the use of a heat sink stratum which is neither insulating nor electrically active but which forms a physical base for a heat radiating subcomponent. Discrete electronic elements or combinations thereof in the form of subcomponents, as for example flatpacks, have been attached to various constructions of printed circuit boards by the soldering of the connecting pins of those elements or subcomponents to portions of the circuit defined through etching or deposition of the electrically conducting strata, the portions being enlarged for physical support and known as pads. Pads have been of particular value in those instances in which the pin of a subcomponent is attached to a conductor through the dielectric board wherein the conductor through the board is made by use of a technique known as through hole plating. Such connections need the physical reinforcement made available by the use of a pad. High circuit density has often in the past been obtained either through the use of closely placed discrete elements or subcomponents on a board construction having multiple strata or through the use of multilayer circuit board construction providing for the close stacking of circuit boards into a common frame or case. Thermal and thermal distribution problems are common in both of these constructions.

SUMMARY OF THE INVENTION

The primary object of this invention is to provide a versatile high circuit density packaging technique providing good thermal management at a reasonable cost. Several features of the new product contribute individually to attain these results, but more importantly, the particular interaction of the features with each other is the real basis for attaining the desired results. The use of a flexible dielectric sheet as the base circuit board enables cladding, etching and mounting of components to be done as work on a large sheet of material, a more simple and efficient operation than the accomplishment of the same work on an equal surface area in a plurality of printed boards of the type that may be stacked in a conventional multilayer structure. The flexible dielectric sheet also contributes to the attainment of a beneficial hole dimension (diameter to length) ratio facilitating through hole plating and permits the use of dummy runs for anchoring purposes in lieu of pads. Inverted mounting of subcomponents, such as flatpacks, on portions of the sheet forming the exterior of loops when the flexible sheet is looped permits establishment of heat transfer contact between the exposed heat sink portion of the flatpack and heat sink or heat conduit portions of the overall package.

Another object of the invention is to provide a novel module packaging for electronic circuitry of value in standardized designs. The folding or looping of the printed circuit board makes possible the use of the same three dimensional space for slightly or even radically different modules in variants of similar electronic instruments or in different instruments having only packaging similarity.

Briefly in accordance with the invention a printed circuit board electronic module is built from a flexible dielectric sheet which is clad on both faces with a metal foil. The metal foil strata are, by means of well known processes as for example photoetching, converted to electrical conductors laid out according to any desired circuitry pattern. Preferably, but not necessarily, the circuit runs in each stratum are parallel to one orthogonal axis in the stratum with the circuit runs in the two strata furnishing, between them, circuit runs in both the X and Y directions. Interconnections between the X and Y circuit runs which are separated by th dielectric sheet are preferably made by means of plated through holes, but not necessarily. The structure facilitates use of plated through holes because the thinness of the sheet in providing a beneficial diameter to length of hole ratio permits relatively simple plating in the void. Electronic elements or subcomponents, as for example flatpacks, are soldered to the metal circuit runs with the heat sink portion of those units facing away from the dielectric sheet. The printed circuit sheet is then loosely folded or looped and attached to frame or package casing by means of connector plugs. The printed sheet is preferably used in a metal casing with the exposed heat sink portions of the electronic components in heat exchanger contact with portions of the casing structure.

DESCRIPTION OF THE PREFERRED EMBODIMENT

Figure 1:
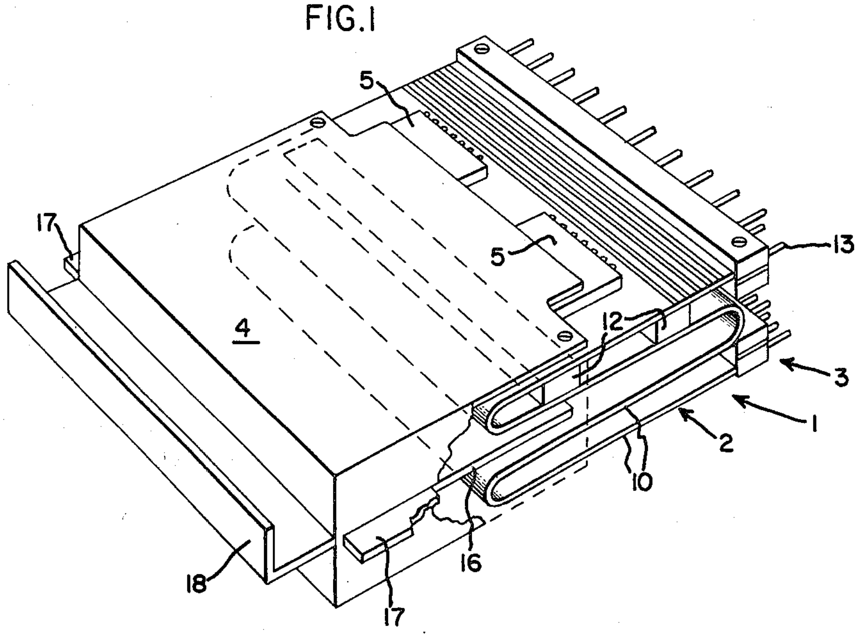
FIG. 1 is a perspective view of an exemplary module according to this invention with its connector plug and folded circuitry partially withdrawn from the module casing.

FIG. 1 depicts an exemplary application of the concepts of the invention to the construction and packaging of electronic modules. The illustration is based on a hypothetical module similar to but less complicated than a particular existing NAFI module utilizing 18 flatpacks to provide an arithematic subunit function of add, subtract, multiply, shift left, and shift right. The less complex module shown in FIG. 1 is made up of the loosely folded printed circuit 2 to which is attached connector strips 3 and the case 4. The principal electronic elements involved are the flatpacks 5 which contain integrated circuit structures appropriate for the mission.

Figure 3:
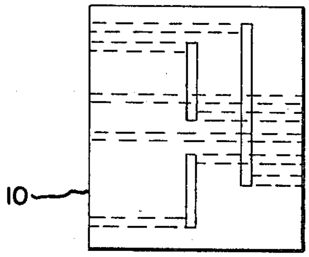
FIG. 3 is a plan view of a portion of an etched sheet showing the orthogonal relationship of the circuit runs in the strata.

The folded printed circuit unit is made up of a flexible dielectric sheet 10 to which was clad on both faces a metal foil. In one implementation of this structure a three mil sheet of polyimide dielectric was clad on both sides with one ounce copper foil. The metal clad dielectric sheet is photoetched to provide the circuit runs by removal of all metal except that to be utilized as the circuit runs or dummy runs and to provide holes in the dielectric sheet itself into which are placed electrical conductors to connect the circuity on the two sides of the sheet. The preference to have all runs on each face parallel to only one orthogonal axis of the sheet as illustrated in FIG. 3 is to facilitate coordination of the circuit runs with the loops or folds so that the only circuitry in the folds is on the interior face of the loop and is only that necessary to carry the circuit from one to the next run of the material. This arrangement is not critical but provides an enhanced reliability by placing the metal constituting the circuit runs in compression and in a protected position precluding snagging when the folded circuit unit is moved in or out of the case.

The holes placed in the sheet to accommodate electrical connection between circuitry strata are photoetched at the same time as the circuitry etching is accomplished to facilitate proper location of the holes and to reduce the steps necessary in fabrication of the unit. Photoetch of the holes provides a better registry than methods of drilling or punching ordinarily used. The diameter of the holes themselves is desirably on the order of not less than one-half of the thickness of the dielectric so as not to exceed the ratio of one to two (diameter to length) to thus fall within the range generally considered efficacious for through hole plating. The present invention facilitates maintenance of this ratio because it is possible to make flexible dielectric sheets extremely thin without sacrificing durability. Additional benefits are obtained as the use of very small holes still within the desired one to two ratio permits the omission of specially designed pads for anchoring of components. Of course, portions of circuit runs proximate the holes provide much of the physical support otherwise requiring use of pads having no other function. In those instances in which an attachment point of a component is at the end of a circuit run and there is neither continuing run on the opposite face nor thru plated hole for support, a cross-over and dummy run segment on the opposite face can be provided without the surface space wastage ordinarily associated with a pad and tab system. The dummy run segment can be run in any direction available without interference with other runs but in view of the mutually exclusive orthogonal parallelism existing between the runs on opposite faces the dummy run segment would probably be at 90° to the circuit runs to which the electronic component is attached.

A practical means of producing a structure according to this invention would be by applying a three-step process of photoetching to the metal clad flexible dielectric laminate previously described. The first step is a photoetching step using a photo mask of the hole pattern to be etched in the metal and the mirror image of that pattern to permit double sided etching to etch the hole pattern in the metal stratum on each face of the laminate. The etched metal itself then serves as the mask for etching the through holes in the dielectric. Etching of the dielectric itself requires a two-step subprocess using two different etchants, as for example, hot concentrated sulphuric acid in a spray etcher in the case of the use of a polyester laminate binding film and a hot caustic spray to etch through the polyimide dielectric strata. Each etching requires the appropriate neutralizing rinses. The second major process step is deposition of an electroless copper coating on the hole walls and on the copper foil surfaces adjacent the holes, followed by a flash electrolytic copper coating. Photoresist and two mirror image photo masks of the areas for through hole plating and dummy run segments are used to establish a pattern for the electrolytic deposition of copper to approximately the same thickness as the circuit runs. A solder plating is then applied to the same areas to facilitate subsequent soldering. Neither the copper nor the solder is electrolytically deposited on areas to be included in circuit runs so as to preclude variation in the thickness of the metal strata ultimately constituting circuit runs so as to avoid variations in conductivity and flexibility. The last major process step is the photoetching of the circuit runs using photoresist and two photo masks which in this case are not mirror image masks but an independent pattern of the X axis runs for one foil strata and of the Y axis runs for the other face of the laminate. In one mechanization using three mil dielectric and one ounce copper foil, electrolytic deposition of copper was 1.5 mils on hole walls and dummy runs followed by a 0.5 mil solder plating.

Flatpacks are then prepared and attached to the printed circuit by rather conventional methods which may be either the mere soldering of the flatpack to the appropriate circuit runs or by the insertion of the flatpack leads through appropriate holes in the sheet and the attachment of leads to circuit runs on the face opposite from the face supporting the flatpacks themselves. In structure according to this invention, flatpacks are placed with the lid against the laminate and the bottom, i.e., the face on which the chip is mounted, and which generally constitutes a heat sink, is placed away from the laminate in outwardly facing relation on the assembled board. This arrangement permits the heat sink surfaces of the flatpacks to be placed into thermal conductivity contact with external heat sinks which may or may not be portions of the frame or casing of the overall package.

Figure 2:
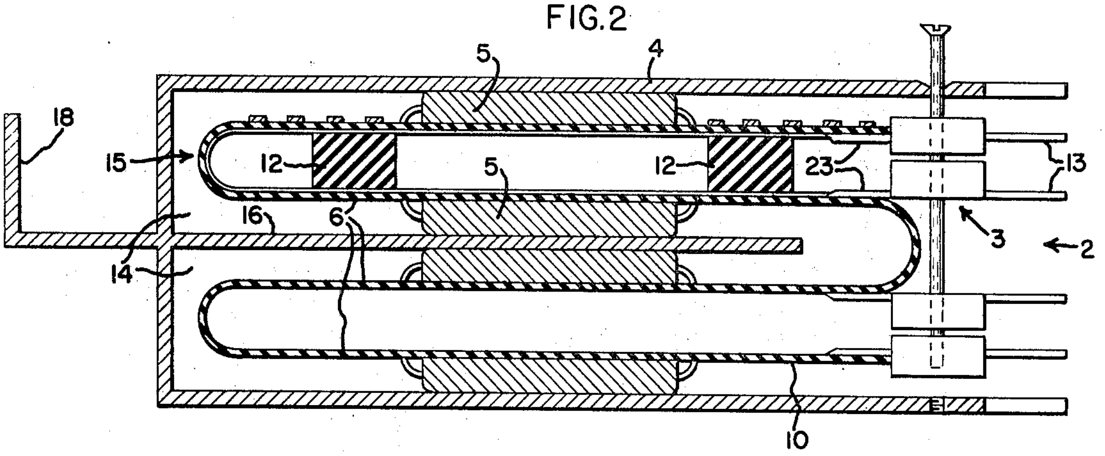
FIG. 2 is a longitudinal cross-section of an exemplary module with the folded flexible circuitry fully inserted in the casing.

The printed circuit with flatpacks and other components attached can then be looped or loosely folded as illustrated at 15 in FIG. 2 and each convolution or complete loop attached to any suitable connector strip as 3 either by soldering, use of compression jaws or a combination of those techniques. Looping of the printed circuit with electronic components attached may be facilitated by the use of spacer blocks 12 which are of course of a dielectric material interiorly of the runs connected by a loop. Obviously the printed circuit itself is looped to place the electronic components on the outside of the runs. A single printed circuit unit 2 can be dimensioned and folded so as to constitute a plurality of convolutions each having two parallel runs 6 and the connecting bight portion as illustrated in FIG. 2. The limitations are that if the folded circuit unit 2 is to be inserted into a preformed case such as the one shown at 4 there must be an even number of runs to permit attachment to connector strips at one side only.

A folded circuit unit such as 2 may be used by plugging into a receptacle by means of pins 13 on the connector strip. Pins 13 may be the ends of conductors 23 extending through the connector strip for contacting or connection to the strips of metal foil remaining on the board and forming circuit runs. The folded circuit unit 2 is, however, more uniquely adaptable for use in module form with an individually tailored case as that illustrated in the drawings as 4. In the module illustrated the case 4 may be made of any convenient material but use of metal gains heat transfer and dissipation benefits. The thermal management benefits may be enhanced by use of a case made with individual compartments 14 to receive each loop 15 of the printed circuit unit 10. Heat transfer between the flatpacks and the sides of case 4 and interior partititions 16 may be facilitated by the dimensioning of the various units so that the flatpacks are placed in physical contact with the casing. In this way a short conductive path of low thermal impedance is provided for extraction of heat from the flatpack by conduction transfer of the heat to the module case. Metallic mounting of the module cases, as for example by the use of rails 17 attached to either side of the case as shown, may facilitate heat transfer to an ultimate heat sink or heat transfer system into which the rails slide on assembly, and heat transfer from the module case also may occur by radiation from a handle member 18 formed integrally therewith. Heat condition through physical contact between flatpacks and case may be facilitated by the use of a compressible resilient material for spacer blocks 12. Use of a filled heat conductive silicon grease on the main surfaces may also be beneficial. The connector strip 3 may also include means for interaction with the case 4 for maintaining the module in assembled condition.

It should be noted that the printed circuit area covered by flatpacks may contain circuit runs with less danger of heat interference. Ceramic case flatpacks will not cause any possibility of electrical shorts between runs but in the case of metal case flatpacks it is expedient to use a dielectric sheet between the case and the laminate. The facility of this arrangement to permit the flatpacks to overlay part of the circuitry contributes to the high circuit density attained as an object of this invention in contradistinction to more conventional circuit board construction wherein the board surface area under flatpacks must be free from circuitry to be reserved for heat dissipation materials.

It is apparent from the foregoing description that many variations can be made in the folded module packaging described, as for example the possible use of an additional flexible laminate or additional strata in a single laminate for common power and ground bus systems or to provide additional circuitry to increase density.

What is claimed as new and desired to be secured by Letters Patent of the United States is:

1. An electronic module comprising:

a. a relatively thin, substantially flexible, dielectric base printed circuit board looped into a plurality of convolutions;

b. electronic components mounted on the exteriors of said convolutions of said board, said components having heat sink surfaces and being mounted with said heat sink surfaces facing away from said board;

c. a connector strip attached to said board and holding said board in its convoluted configuration; and d. a case made of materials selected for their thermal conductive qualities and having a plurality of compartments of the same number as there are convolutions in said board, said board in its convoluted condition being removably secured in said case with one loop in each said compartment with said heat sink surfaces of said electronic components being in heat transfer contact with said case.

2. An electronic module comprising:

a. a thin, pliable, easily flexed printed circuit board loosely folded to form one or more loops;

b. electronic components mounted on the board on oppositely facing exterior surfaces of each of said one or more loops with said electronic components having outwardly facing heat sink portions;

c. a connector strip attached to said board, holding said board in its looped configuration and having conductors extending through said connector strip from connection to said circuit board on one end to terminal pins on the other end; and d. a casing surrounding said looped board and attached to said connector strip whereby said heat sink portions of said components make heat transfer contact with said casing and whereby said terminal pins of said conductors protruding from said connector strip form a male socket.

3. An electronic module comprising:

a. a thin, pliable, easily flexed printed circuit board loosely folded into one or more loops;

b. electronic components mounted on the board on oppositely facing exterior surfaces of each of said one or more loops with said electronic components having outwardly facing heat sink portions;

c. a connector strip attached to said board; and d. a case made of materials selected for heat conduction and transfer qualities and having a separate compartment for each said loop into which the board is folded, said case surrounding and containing said board in its convoluted condition whereby the heat sink portions of said components make heat transfer contact with said case.

* * * * *